(12) United States Patent
Gong et al.

(10) Patent No.: US 12,207,427 B2
(45) Date of Patent: Jan. 21, 2025

(54) LED DISPLAY SCREEN

(71) Applicant: SHENZHEN LEYARD OPTO-ELECTRONIC CO., LTD., Guangdong (CN)

(72) Inventors: Jie Gong, Guangdong (CN); Xuechao Sun, Guangdong (CN); Ming Liu, Guangdong (CN)

(73) Assignee: SHENZHEN LEYARD OPTO-ELECTRONIC CO., LTD., Shenzhen (CN)

( * ) Notice: Subject to any disclaimer, the term of this patent is extended or adjusted under 35 U.S.C. 154(b) by 64 days.

(21) Appl. No.: 18/228,703

(22) Filed: Aug. 1, 2023

(65) Prior Publication Data
US 2024/0090152 A1    Mar. 14, 2024

(30) Foreign Application Priority Data
Sep. 8, 2022 (CN) .......................... 202211097485.1

(51) Int. Cl.
*G06F 1/16*     (2006.01)
*H05K 5/00*     (2006.01)
(Continued)

(52) U.S. Cl.
CPC ............. *H05K 5/061* (2013.01); *H05K 5/063* (2013.01); *H05K 5/069* (2013.01); *H01L 25/0753* (2013.01)

(58) Field of Classification Search
CPC ........ H05K 5/061; H05K 5/063; H05K 5/069; H05K 5/064; H05K 5/065; H05K 5/066;
(Continued)

(56) References Cited

U.S. PATENT DOCUMENTS 8,154,864 B1 * 4/2012 Nearman ............. H05K 7/2039
                                                 361/679.01
2009/0032825 A1 * 2/2009 Mo ........................ G09F 13/22
                                                 257/E33.001
(Continued)

FOREIGN PATENT DOCUMENTS

| CN | 207833816 U | 9/2018 |
|---|---|---|
| CN | 211124842 U | 7/2020 |
| CN | 211403932 U | 9/2020 |

OTHER PUBLICATIONS

The extended European search report of the corresponding EP patent application No. 23189770.3, mail date Feb. 1, 2024.

*Primary Examiner* — Anthony M Haughton
(74) *Attorney, Agent, or Firm* — Samson G. Yu

(57) ABSTRACT

The disclosure provides a Light Emitting Diode (LED) display screen, which includes a box body, a power box, a display module and a sealing assembly. The sealing assembly includes: a sealing frame, which is disposed at the first wiring hole and provided with a second wiring hole for avoiding the connecting wire, and a floating gap is formed between the sealing frame and the power box; a first elastic seal ring, which is disposed on the sealing frame and surrounds the second wiring hole, and the display module is connected with the sealing frame and is in butt fit with the first elastic seal ring; and a second elastic seal ring, an outer side of the second elastic seal ring is connected with the power box, an inner side of the second elastic seal ring is connected with the sealing frame and surrounds the second wiring hole.

10 Claims, 6 Drawing Sheets

(51) Int. Cl.
  *H05K 5/06* (2006.01)
  *H05K 7/00* (2006.01)
  *H01L 25/075* (2006.01)

(58) Field of Classification Search
  CPC ........ H05K 5/067; H05K 5/068; H05K 5/062; H05K 5/06
  See application file for complete search history.

(56) References Cited

U.S. PATENT DOCUMENTS

| | | | |
|---|---|---|---|
| 2011/0134346 A1* | 6/2011 | Hayashi | G02F 1/133308 |
| | | | 348/790 |
| 2021/0063009 A1* | 3/2021 | Zhang | G09F 9/33 |
| 2021/0185839 A1 | 6/2021 | Liu et al. | |
| 2022/0408577 A1* | 12/2022 | Zhang | G09F 9/33 |
| 2023/0392780 A1* | 12/2023 | Li | F21V 19/0015 |
| 2024/0361808 A1* | 10/2024 | Lee | G06F 1/203 |

\* cited by examiner

LED DISPLAY SCREEN

CROSS-REFERENCE TO RELATED APPLICATION

The present disclosure claims priority to Chinese Patent Application No. 202211097485.1, filed to the China National Intellectual Property Administration on Sep. 8, 2022 and entitled "LED Display Screen", the disclosure of which is hereby incorporated by reference in its entirety.

TECHNICAL FIELD

The disclosure relates to the technical field of Light Emitting Diode (LED) display screens, in particular to an LED display screen.

BACKGROUND

LED display screens are widely used in stage, commercial performance, advertisement, exhibition and the like industries, with excellent display effect, outdoor LED display screens are increasingly in demand. Although outdoor LED display screens have some water resistance, the water-resistant effect is poor. Rainwater easily enters into a power box through an opening, for wiring with a display module, of the power box, so that short circuit of a circuit board in the power box is caused, resulting in scrap of the LED display screens.

In the related art, by disposing a seal ring between the display module and the power box, the display module and the power box can be sealed to be resistant by utilizing compression deformation of the seal ring. However, the seal ring in the related art still has a risk of water leakage due to failure.

SUMMARY

The disclosure provides an LED display screen, to solve the problem that a seal ring in the related art has the risk of water leakage due to failure.

The disclosure provides an LED display screen, which includes a box body, a power box, a display module and a sealing assembly. The power box and the display module are both disposed on the box body, the power box is provided with a first wiring hole, an electric device in the power box is electrically connected with the display module through a connecting wire penetrating through the first wiring hole. The sealing assembly includes: a sealing frame, which is disposed at the first wiring hole and provided with a second wiring hole for avoiding the connecting wire, and a floating gap is formed between the sealing frame and the power box; a first elastic seal ring, which is disposed on the sealing frame and surrounds the second wiring hole, and the display module is connected with the sealing frame and is in butt fit with the first elastic seal ring so as to seal a joint of the display module and the sealing frame; and a second elastic seal ring, an outer side of the second elastic seal ring is connected with the power box, an inner side of the second elastic seal ring is connected with the sealing frame and surrounds the second wiring hole so as to seal the floating gap, and the sealing frame is supported by the second elastic seal ring so that the sealing frame is disposed in a floating mode relative to the power box.

Furthermore, the second elastic seal ring includes a first connecting section, a first deformation section and a second connecting section which are sequentially connected from outside to inside, the first connecting section, the first deformation section and the second connecting section are all annular, the first connecting section is connected with the power box, the second connecting section is connected with the sealing frame and located on an outer side of the second wiring hole, and at least part of a longitudinal section of the first deformation section is of an arc-shaped structure.

Furthermore, a whole of the longitudinal section of the first deformation section is arc-shaped, and a middle part of the first deformation section protrudes towards a direction away from the sealing frame.

Furthermore, the sealing assembly further includes: a first annular pressing plate, which is connected with the power box, and the first connecting section is clamped between the first annular pressing plate and the power box; and/or a second annular pressing plate, which is connected with the sealing frame, and the second connecting section is clamped between the second annular pressing plate and the sealing frame.

Furthermore, the sealing frame includes a base and a first connecting cylinder disposed on the base, the second wiring hole is formed by an inner space of the first connecting cylinder, the display module is provided with a second connecting cylinder, the first connecting cylinder is in plug-in connection with the second connecting cylinder, and the first elastic seal ring is clamped between the first connecting cylinder and the second connecting cylinder in a radial direction of the second wiring hole.

Furthermore, the first elastic seal ring includes a third connecting section, a second deformation section and a fourth connecting section which are sequentially connected along an axial direction of the second wiring hole, the third connecting section, the second deformation section and the fourth connecting section are all annular, both the third connecting section and the fourth connecting section abut against a cylinder wall of the first connecting cylinder, the second deformation section protrudes out of the third connecting section and the fourth connecting section in the radial direction of the second wiring hole, the second deformation section abuts against a cylinder wall of the second connecting cylinder, and at least part of a longitudinal section of the second deformation section is wave-shaped.

Furthermore, a limiting structure is disposed between the sealing frame and the power box to limit a moving stroke of the sealing frame when floating relative to the power box.

Furthermore, the limiting structure includes a limiting cylinder disposed on a bottom wall of the sealing frame and surrounding the second wiring hole, the limiting cylinder extends downwards into the first wiring hole, and the floating gap includes a lateral floating gap formed between the limiting cylinder and a hole wall of the first wiring hole.

Furthermore, the inner side of the second elastic seal ring is connected to the bottom wall of the sealing frame and located on an inner side of the limiting cylinder, and the outer side of the second elastic seal ring is connected to an inner surface of a top wall of the power box.

Furthermore, the limiting structure further includes: an annular limiting plate, which is disposed on a side wall of the sealing frame and surrounds the second wiring hole, the limiting cylinder extends upwards to a lower surface of the limiting plate; and an annular projection, which is disposed on an outer surface of the top wall of the power box and surrounds the first wiring hole, and the floating gap further includes a longitudinal floating gap formed between the lower surface of the annular limiting plate and an upper surface of the annular projection.

With the adoption of the technical solution of the disclosure, the LED display screen includes the box body, the power box, the display module and the sealing assembly, the joint of the display module and the sealing frame is sealed by the first elastic seal ring and the joint of the sealing frame and the display module is sealed by the second elastic seal ring, thereby preventing rainwater from entering into the power box through the first wiring hole or the second wiring hole and preventing internal circuit of the power box from scrap caused by short circuit. The floating gap is formed between the sealing frame and the power box, the sealing frame is supported by the second elastic seal ring, therefore, when a position offset occurs between the display module and the power box, the sealing frame is enabled to float relative to the power box by utilizing elastic deformation of the second elastic seal ring, so that the position offset between the display module and the power box is eliminated, the position offset between the sealing frame and the display module is reduced, thereby ensuring an even distribution of the amount of compression deformation of the first elastic seal ring 42 around its circumference, promoting the use reliability of the sealing assembly, further, avoiding short circuit of the internal circuit caused by water entering into the power box, prolonging the service life of the LED display screen, and promoting the use safety of the LED display screen.

BRIEF DESCRIPTION OF THE DRAWINGS

The accompanying drawings, which constitute a part of the application, are used to provide a further understanding of the disclosure, and the exemplary embodiments of the disclosure and the description thereof are used to explain the disclosure, but do not constitute improper limitations to the disclosure. In the drawings.

Figure 1:
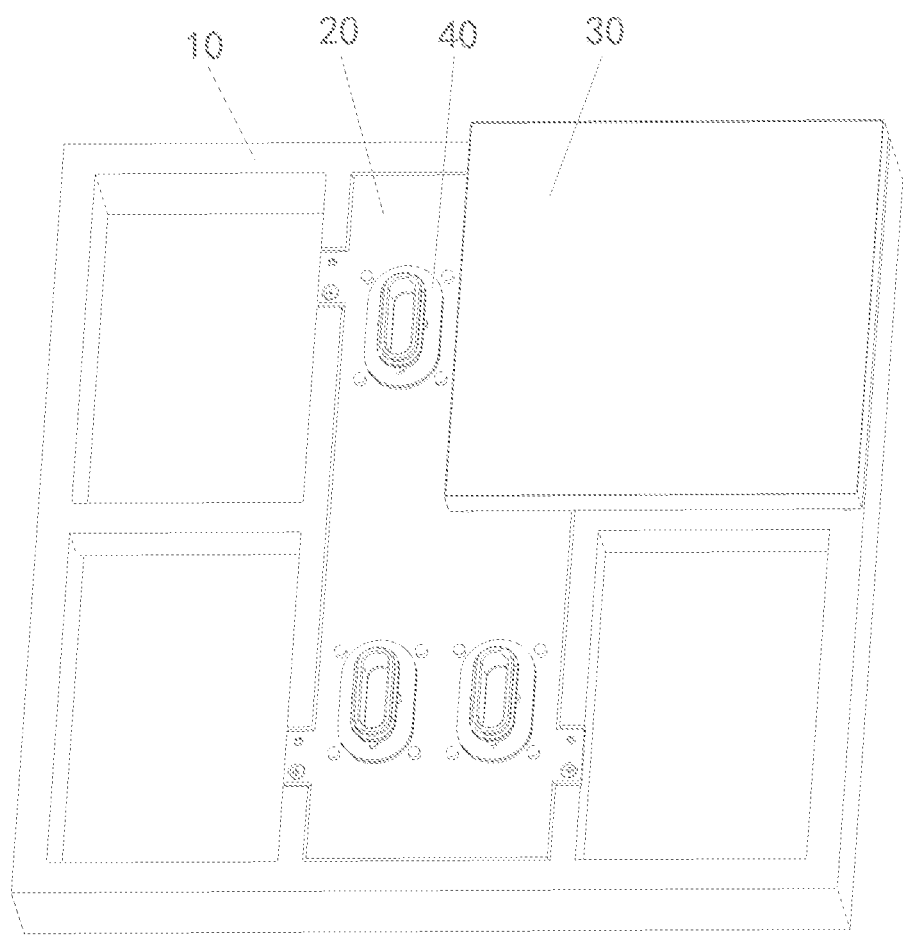
FIG. 1 illustrates a schematic structure diagram of an LED display screen provided by an embodiment of the disclosure.
Figure 2:
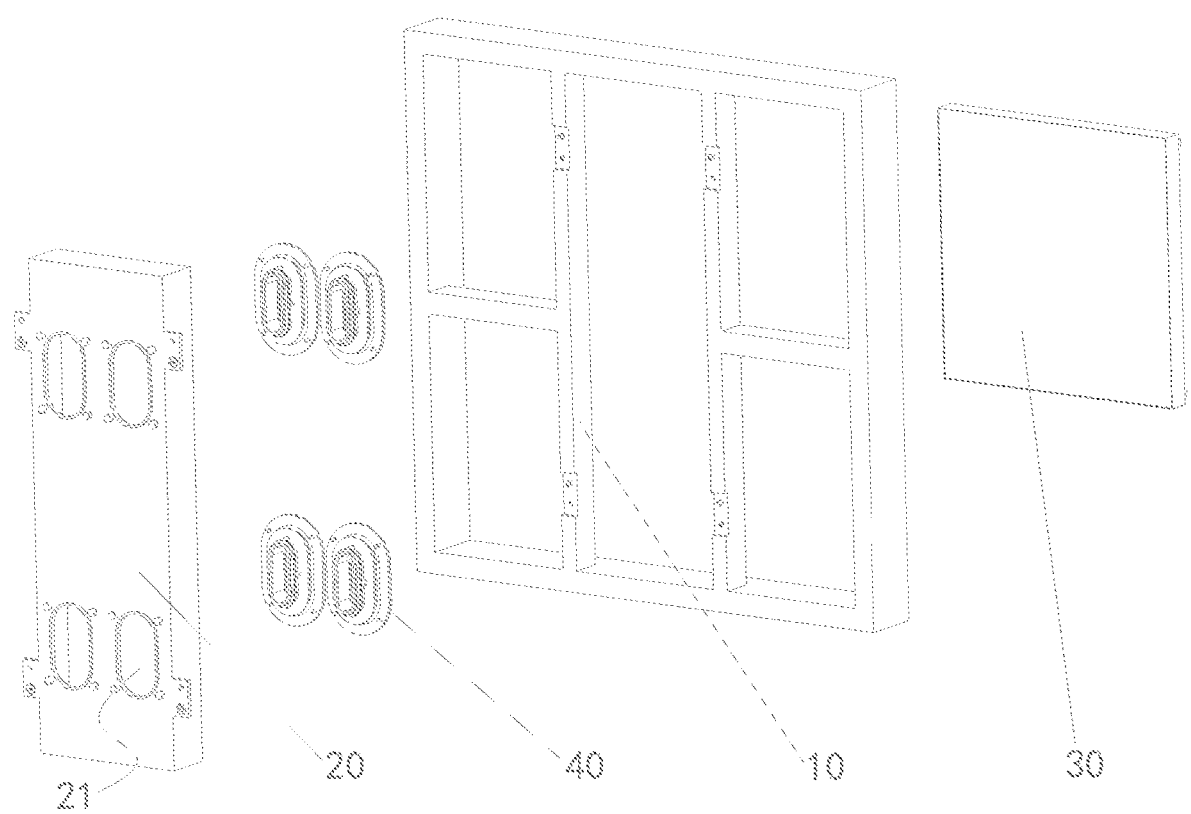
FIG. 2 illustrates a schematic structure diagram of an exploded view of an LED display screen provided by an embodiment of the disclosure.

The drawings include the following reference signs:
10. Box body; 20. Power box; 21. First wiring hole; 30. Display module; 31. Second connecting cylinder;
40. Sealing assembly; 41. Sealing frame; 411. Second wiring hole; 412. Base; 413. First connecting cylinder; 42. First elastic seal ring; 421. Third connecting section; 422. Second deformation section; 423. Fourth connecting section; 43. Second elastic seal ring; 431. First connecting section; 432. First deformation section; 433. Second connecting section; 44. First annular pressing plate; 45. Second annular pressing plate;
50. Limiting structure; 51. Limiting cylinder; 53. Annular limiting plate; and 54. Annular projection.

DETAILED DESCRIPTION OF THE EMBODIMENTS

The technical solutions in the embodiments of the disclosure will be clearly and completely described below in combination with the drawings in the embodiments of the disclosure, and it is apparent that the described embodiments are not all but part of the embodiments of the disclosure. In fact, the description of at least one exemplary embodiment below is merely illustrative, and will not be taken as any limitation to the disclosure and its application or use. All other embodiments obtained by those of ordinary skill in the art on the basis of the embodiments in the disclosure without creative work shall fall within the scope of protection of the disclosure.

As shown in FIGS. 1-7, the embodiments of the disclosure provide an LED display screen, which includes a box body 10, a power box 20, a display module 30 and a sealing assembly 40. The power box 20 and the display module 30 are both disposed on the box body 10, the power box 20 is provided with a first wiring hole 21, and an electric device in the power box 20 is electrically connected with the display module 30 through a connecting wire penetrating through the first wiring hole 21. The sealing assembly 40 includes: a sealing frame 41, a first elastic seal ring 42 and a second elastic seal ring 43, the sealing frame 41 is disposed at the first wiring hole 21 and provided with a second wiring hole 411 for avoiding the connecting wire, a floating gap is formed between the sealing frame 41 and the power box 20, the first elastic seal ring 42 is disposed on the sealing frame 41 and surrounds the second wiring hole 411, the display module 30 is connected with the sealing frame 41 and is in butt fit with the first elastic seal ring 42 so as to seal a joint of the display module 30 and the sealing frame 41, an outer side of the second elastic seal ring 43 is connected with the power box 20, an inner side of the second elastic seal ring 43 is connected with the sealing frame 41 and surrounds the second wiring hole 411 so as to seal the floating gap, and the sealing frame 41 is supported by the second elastic seal ring 43 so that the sealing frame 41 is disposed in a floating mode relative to the power box 20.

With the adoption of the LED display screen provided by the embodiment, the LED display screen includes the box body 10, the power box 20, the display module 30 and the sealing assembly 40, the joint of the display module 30 and the sealing frame 41 is sealed by the first elastic seal ring 42 and the joint of the sealing frame 41 and the display module 30 is sealed by the second elastic seal ring 43, thereby preventing rainwater from entering into the power box 20 through the first wiring hole 21 or the second wiring hole 411 and preventing internal circuit of the power box 20 from scrap caused by short circuit. The floating gap is formed between the sealing frame 41 and the power box 20, the sealing frame 41 is supported by the second elastic seal ring 43, therefore, when a position offset occurs between the display module 30 and the power box 20, the sealing frame 41 is enabled to float relative to the power box 20 by utilizing elastic deformation of the second elastic seal ring 43, so that the position offset between the display module 30 and the power box 20 is eliminated, the position offset between the sealing frame 41 and the display module 30 is reduced, thereby ensuring an even distribution of the amount of compression deformation of the first elastic seal ring around its circumference, promoting the use reliability of the sealing assembly 40, further, avoiding short circuit of the internal circuit caused by water entering into the power box 20, prolonging the service life of the LED display screen, and promoting the use safety of the LED display screen.

In the related art, the sealing structure between the display module 30 and the power box 20 includes the following two ways.

The first (Comparative Example 1) is: an elastic seal ring is disposed on the front face of the power box 20 and surrounds the first wiring hole 21, the display module 30 is disposed on the box body 10 such that the first wiring hole 21 and the second wring hoe 411 are aligned, the elastic seal ring is clamped between the power box 20 and the display module 30 in the front-rear direction, and the longitudinal section of the elastic seal ring adopts a hollow structure.

The second (Comparative Example 2) is: one end of the sealing frame is fixed to the front face of the power box 20 and surrounds the first wiring hole 21, the elastic seal ring sleeves the sealing frame and surrounds the first wiring hole 21, the display module 30 is disposed on the box body 10 such that the other end of the sealing frame penetrates into the insertion hole of the display module 30, the elastic seal ring is clamped between the outer wall of the sealing frame and the hole wall of the insertion hole of the display module 30, and an annular protrusion is disposed on the outer side wall of the elastic seal ring around its axis.

However. Comparative Example 1 has the problem that the sealing effect of the elastic seal ring is unreliable or the display effect of the LED display screen is poor; in a case where there is an installation error between the display module 30 and the power box 20, Comparative Example 2 has the problem that the sealing effect of the elastic seal ring is poor or the display effect of the LED display screen is poor.

Meanwhile, through detailed analytical studies on both structures by the inventor, it is found that in Comparative Example 1, the elastic seal ring is disposed on the front face of the power box 20, the compression deformation force of the elastic seal ring acts on the back face of the display module 30, the elastic seal ring pushes the display module 30 to be separated from the box body 10 or pushes the display module 30 to deform, such that the elastic seal ring is unable to normally seal the first wiring hole 21 and the second wiring hole 411, or the elastic seal ring pushes the display module 30 to deform, so that the display effect of the LED display screen is affected; it is found that in Comparative Example 2, when there is an installation error between the display module 30 and the power box 20, the sealing frame has a position offset in the radial direction of the insertion hole of the display module 30 relative to the insertion hole of the display module 30, since the elastic seal ring is clamped between the outer wall of the sealing frame and the hole wall of the insertion hole of the display module 30, the amount of compression of the elastic seal ring in its circumference is non-uniform, on the one hand, a position with a small amount of compression of the elastic seal ring is not able to effectively seal the first wiring hole 21 and the second wiring hole 411, such that water enters into the power box 20 to cause a short circuit of the internal circuit, on the other hand, the compression deformation forces generated by the elastic seal ring in its circumference are non-uniform, the second wiring hole 411 is subjected to the imbalance forces around its circumferential direction from the elastic seal ring, after the second wiring hole 411 reaches force balance, the position of the display module 30 on the box body 10 has an offset under the action of the elastic seal ring, resulting in uneven spacing between the display modules 30, further resulting in light or dark lines of the LED display screen, which affects the display effect of the LED display screen.

The power box 20 and the box body 10 are of separate structures, the first wiring hole 21 is formed in the front face of the power box 20, the side the power box 20 is provided with connecting plates, the back face of the connecting plate attaches to the front face of the box body 10, and the connecting plate is fixed to the front face of the box body 10 by fasteners, thereby the power box 20 is fixed to the front face of the box body 10.

Figure 5:
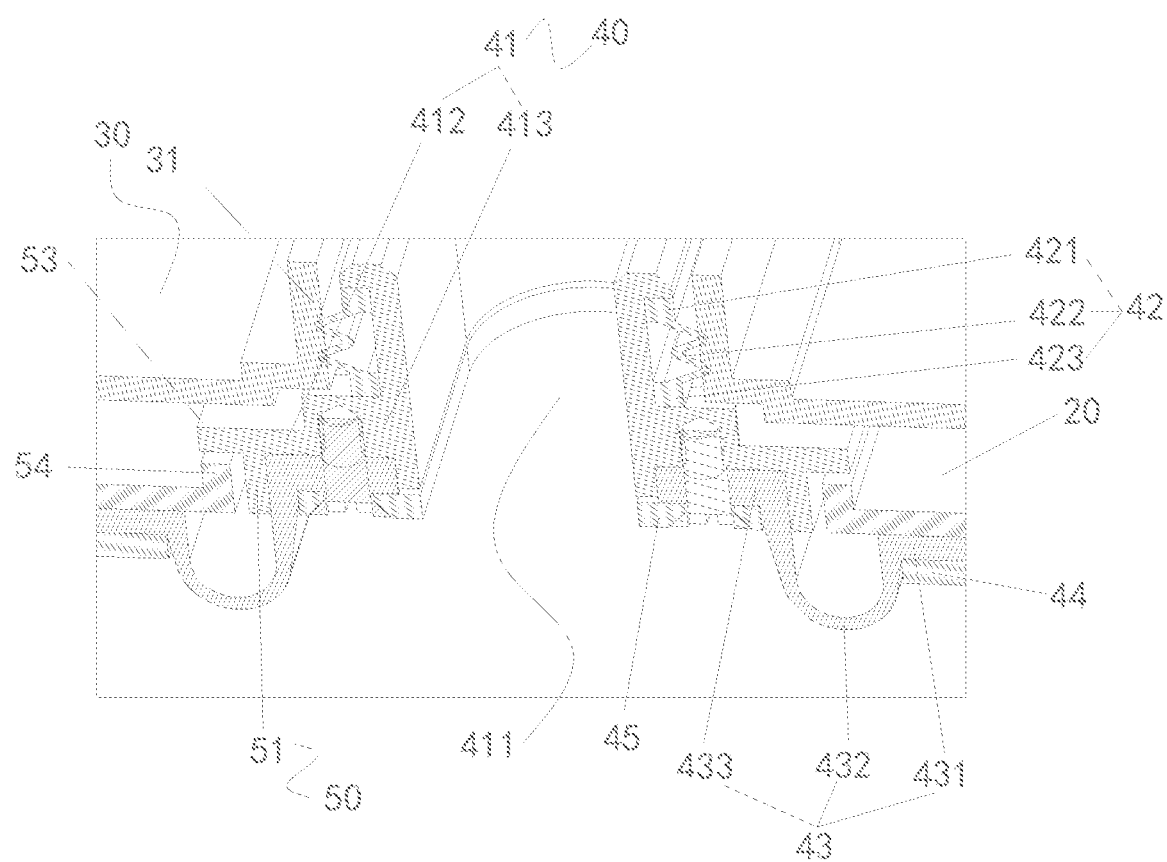
FIG. 5 illustrates an enlarged partial schematic diagram of A in FIG. 4.
Figure 6:
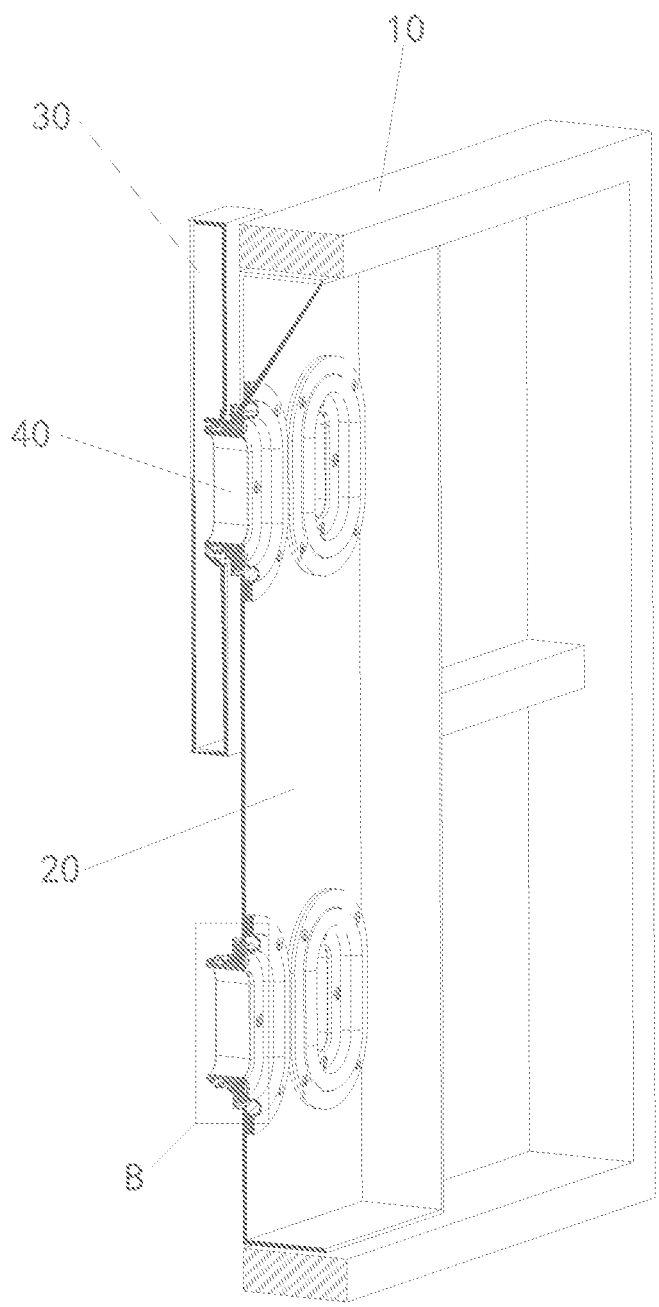
FIG. 6 illustrates another schematic structure diagram of a cross-sectional view of an LED display screen provided by an embodiment of the disclosure.
Figure 7:
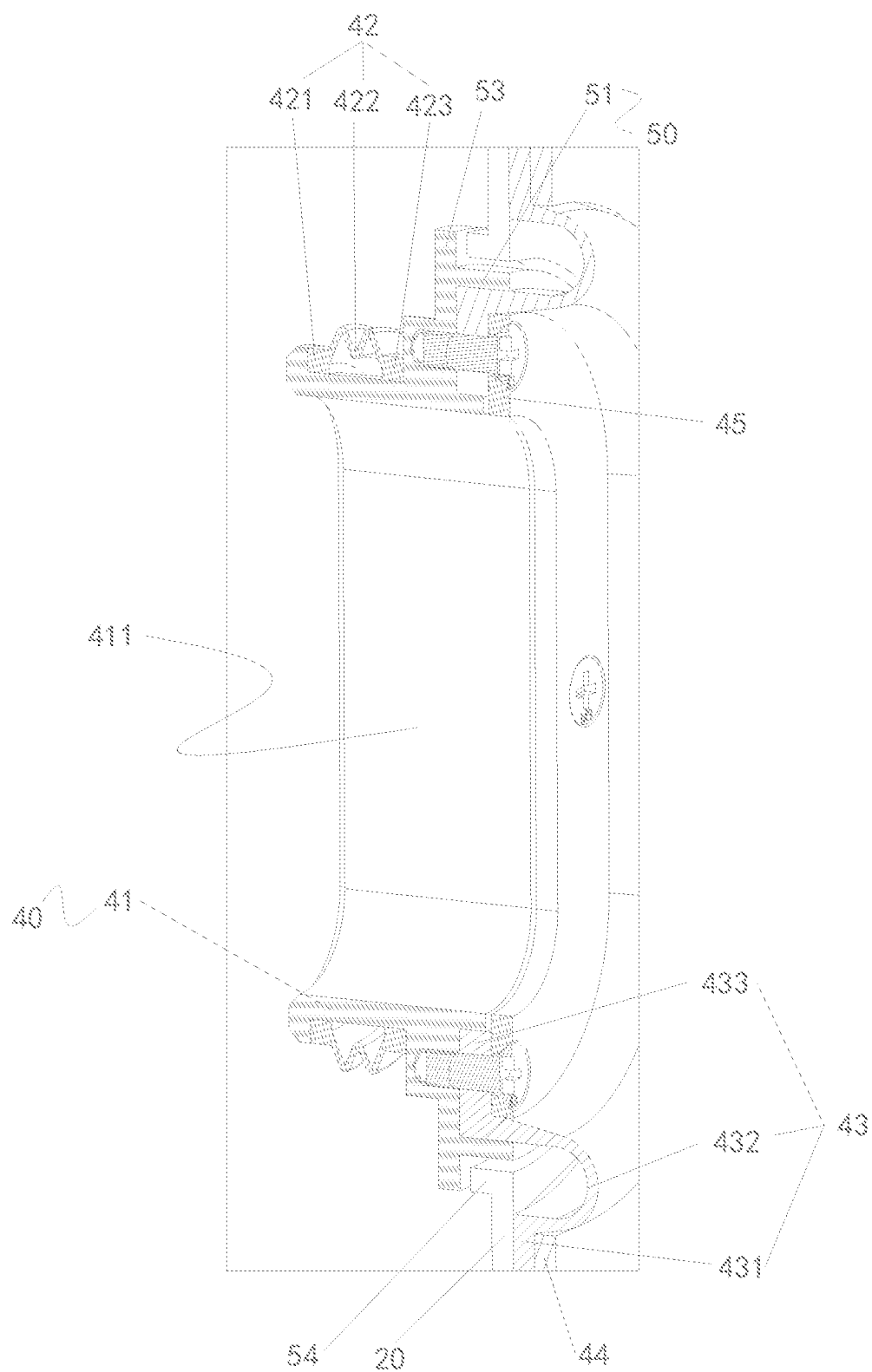
FIG. 7 illustrates an enlarged partial schematic diagram of B in FIG. 6.

As shown in FIGS. 5 and 7, the second elastic seal ring 43 includes a first connecting section 431, a first deformation section 432 and a second connecting section 433 which are sequentially connected from outside to inside, the first connecting section 431, the first deformation section 432 and the second connecting section 433 are all annular, the first connecting section 431 is connected with the power box 20, the second connecting section 433 is connected with the sealing frame 41 and located on an outer side of the second wiring hole 411, and at least part of a longitudinal section of the first deformation section 432 is of an arc-shaped structure. When a position offset occurs between the display module 30 and the power box 20, since the first connecting section 431, the first deformation section 432 and the second connecting section 433 are annular, such that the second elastic seal ring 43 is capable of absorbing position offsets of the display module 30 from the power box 20 in various directions, while the position offset between the sealing frame 41 and the display module 30 is reduced, the axis of the second wiring hole 411 of the sealing frame 41 is always perpendicular to the box body 10, then short circuit of the internal circuit of the display module 30 caused by failure of the sealing assembly 40 is avoided, the service life of the LED display screen is prolonged, and the use safety of the LED display screen is improved. Moreover, since at least part of the longitudinal section of the first deformation section 432 is of an arc-shaped structure, when a position offset occurs between the display module 30 and the power box 20, the first deformation section 432 is capable of deforming to absorb the position offset between the display module 30 and power box 20, so that the sealing waterproofing effect of the first elastic seal ring 42 on the display module 30 is further guaranteed.

It is to be noted that the longitudinal section of the first deformation section 432 includes an arc-shaped structure refers to that the longitudinal section of the first deformation section 432 is all of the arc-shaped structure, or the longitudinal section of the first deformation section 432 is partially of an arc-shaped structure.

The longitudinal section of the first deformation section 432 refers to the cross-section of the first deformation section 432 taken in the up-down direction in FIG. 5, in which direction the section of the first deformation section 432 includes the arc-shaped structure.

As shown in FIGS. 5 and 7, a whole of the longitudinal section of the first deformation section 432 is arc-shaped, and a middle part of the first deformation section 432 protrudes towards a direction away from the sealing frame 41. The whole of the longitudinal section of the first deformation section 432 is arc-shaped, when the first deformation section 432 is subjected to the action force of the same magnitude, the amount of deformation generated by the first deformation section 432 increases, the first deformation section 432 is more prone to deformation, when a position offset occurs between the display module 30 and the power box 20, the first deformation section 432 is capable of absorbing most of the position offset between the display module 30 and power box 20, then the position offset between the sealing frame 41 and the display module 30 is further reduced, and the sealing waterproofing effect of first elastic seal ring 42 on the display module 30 is further guaranteed.

Figure 3:
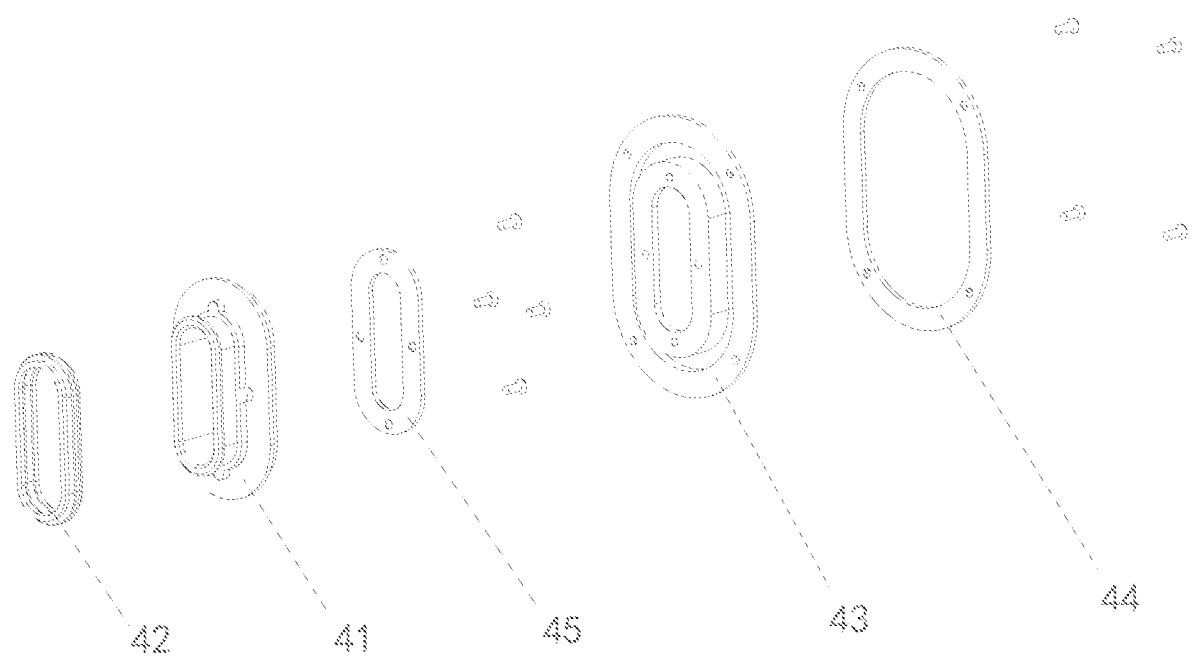
FIG. 3 illustrates a schematic structure diagram of an exploded view of a sealing assembly of an LED display screen provided by an embodiment of the disclosure.
Figure 4:
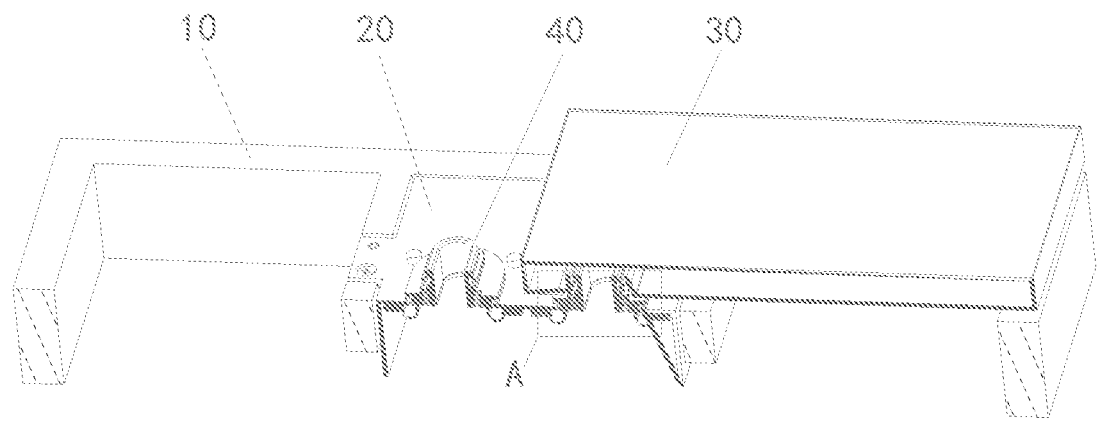
FIG. 4 illustrates a schematic structure diagram of a cross-sectional view of an LED display screen provided by an embodiment of the disclosure.

As shown in FIGS. 3, 5 and 7, the sealing assembly 40 further includes a first annular pressing plate 44, which is connected with the power box 20, and the first connecting section 431 is clamped between the first annular pressing plate 44 and the power box 20. The first connecting section 431 is clamped between the first annular pressing plate 44 and the power box 20, and when the first deformation section 432 has elastic deformation, reliable connection between the first connecting section 431 and the power box 20 is guaranteed, thereby improving the use reliability of the LED display screen.

As shown in FIGS. 3, 5 and 7, the sealing assembly 40 further includes a second annular pressing plate 45, which is connected with the sealing frame 41, and the second connecting section 433 is clamped between the second annular pressing plate 45 and the sealing frame 41. The second connecting section 433 is clamped between the second annular pressing plate 45 and the sealing frame 41, and when the first deformation section 432 has elastic deformation, reliable connection between the second connecting section 433 and the sealing frame 41 is guaranteed, thereby improving the use reliability of the LED display screen.

As shown in FIG. 5, the sealing frame 41 includes a base 412 and a first connecting cylinder 413 disposed on the base 412, the second wiring hole 411 is formed by an inner space of the first connecting cylinder 413, the display module 30 is provided with a second connecting cylinder 31, the first connecting cylinder 413 is in plug-in connection with the second connecting cylinder 31, and the first elastic seal ring 42 is clamped between the first connecting cylinder 413 and the second connecting cylinder 31 in a radial direction of the second wiring hole 411. The first connecting cylinder 413 is in plug-in connection with the second connecting cylinder 31, and the first elastic seal ring 42 is clamped between the first connecting cylinder 413 and the second connecting cylinder 31, so that the first elastic seal ring 42 generates compression deformation under squeezing of the sealing frame 41 and the second connecting cylinder 31 in the radial direction thereof, the first elastic seal ring 42 seals the gap between the first connecting cylinder 413 and the second connecting cylinder 31, preventing the rainwater from entering into the display module 30 through the through hole enclosed by the second connecting cylinder 31, the service life of the LED display screen is prolonged, and the use safety of the LED display screen is improved. Meanwhile, since the direction of the compression deformation force of the first elastic seal ring 42 acting on the display module 30 is parallel to the display module 30, the display module 30 is not subjected to the compression deformation force of the first elastic seal ring 42 in the front-rear direction, preventing the first elastic seal ring 42 from pushing the display module 30 to be separated from the box body 10 or from pushing the display module 30 to deform, the first elastic seal ring 42 normally seals the first wiring hole 21 and the second wiring hole 411, the display picture of the display module 30 is guaranteed, and the display effect of the LED display screen is guaranteed.

A shown in FIG. 5, in the embodiment, the first connecting cylinder 413 penetrates in the second connecting cylinder 31, the first elastic seal ring 42 is clamped between the outer side wall of the first connecting cylinder 413 and the inner side wall of the second connecting cylinder 31, in other embodiments, the second connecting cylinder 31 penetrates in the first connecting cylinder 413, and the first elastic seal ring 42 is clamped between the inner side wall of the first connecting cylinder 413 and the outer side wall of the second connecting cylinder 31.

As shown in FIGS. 5 and 7, the first elastic seal ring 42 includes a third connecting section 421, a second deformation section 422 and a fourth connecting section 423 which are sequentially connected along an axial direction of the second wiring hole 411, the third connecting section 421, the second deformation section 422 and the fourth connecting section 423 are all annular, both the third connecting section 421 and the fourth connecting section 423 abut against a cylinder wall of the first connecting cylinder 413, the second deformation section 422 protrudes out of the third connecting section 421 and the fourth connecting section 423 in the radial direction of the second wiring hole 411, the second deformation section 422 abuts against a cylinder wall of the second connecting cylinder 31, and at least part of a longitudinal section of the second deformation section 422 is wave-shaped. At a certain amount of deformation of the second deformation section 422, since at least part of the longitudinal section of the second deformation section 422 is wave-shaped, the second deformation section 422 is able to provide a greater elastic force, thereby guaranteeing the sealing effect of the second deformation section 422 on the gap between the through hole enclosed by the second connecting cylinder 31 and the sealing frame 41, prolonging the service life of the LED display screen, and improving the use safety of the LED display screen, It is to be noted that the second deformation section 422 protrudes out of the third connecting section 421 and the fourth connecting section 423 in the radial direction of the sealing frame 41 refers to that the maximum diameter of the second deformation section 422 is greater than the maximum diameter of the third connecting section 421 and the maximum diameter of the second deformation section 422 is greater than the maximum diameter of the fourth connecting section 423 in the axial direction of the sealing frame 41.

The radial direction of the sealing frame 41 refers to the left-right direction in FIG. 5, and the axial direction of the sealing frame 41 refers to the up-down direction in FIG. 5.

It is to be noted that the longitudinal section of the second deformation section 422 includes a wave-shaped structure refers to that the longitudinal section of the second deformation section 422 is all of the wave-shaped structure, or the longitudinal section of the second deformation section 422 is partially of the wave-shaped structure.

The longitudinal section of the second deformation section 422 refers to the cross-section of the second deformation section 422 taken in the up-down direction in FIG. 5, in which direction the section of the second deformation section 422 includes the arc-shaped structure.

In the embodiment, the first deformation section 432 is prone to deformation compared with the second deformation section 422. When a position offset occurs between the display module 30 and the power box 20, since the first deformation section 432 is prone to deformation compared with the second deformation section 422, the amount of deformation generated by the first deformation section 432 is greater than the amount of deformation generated by the second deformation section 422, so that the first deformation section 432 is capable of absorbing most of the position offset between the display module 30 and power box 20, then the position offset between the sealing frame 41 and the display module 30 is further reduced, and the sealing waterproofing effect of second elastic seal ring 422 on the display module 30 is guaranteed.

It is to be noted that, the first deformation section 432 is prone to deformation compared with the second deformation section 422 under the condition that the first deformation section 432 and the second deformation section 422 adopt the same material may be implemented in three ways.

In the first way, the longitudinal section of the first deformation section 432 is an arc-shaped section, the longitudinal section of the second deformation section 422 is a wavy shape formed by bending for a plurality of times at an acute angle, since the bending frequency and bending degree of the first deformation section 432 are smaller than those of the second deformation section 422, so that the first deformation section 432 is prone to deformation compared with the second deformation section 422.

In the second way, the thickness of the first deformation section 432 is smaller than the thickness of the second deformation section 422 such that the first deformation section 432 is further more prone to deformation compared with the second deformation section 422.

In the third way, the longitudinal section of the first deformation section 432 is an arc-shaped section, the longitudinal section of the second deformation section 422 is a wavy shape formed by bending for a plurality of times at an acute angle, the thickness of the first deformation section 432 is smaller than that of the second deformation section 422, so that the first deformation section 432 is further more prone to deformation compared with the second deformation section 422.

Of course, that the first deformation section 432 is prone to deformation compared with the second deformation section 422 is not limited to the above three ways, as long as the amount of deformation generated by the first deformation section 432 is greater than the amount of deformation generated by the second deformation section 422 under the condition that the first deformation section 432 and the second deformation section 422 are subjected to the action force of the same magnitude.

As shown in FIGS. 5 and 7, a limiting structure 50 is disposed between the sealing frame 41 and the power box 20 to limit a moving stroke of the sealing frame 41 relative to the power box 20. The limiting structure 50 limits the moving stroke of the sealing frame 41 when floating relative to the power box 20, so that excessive moving stroke of the sealing frame 41 when floating relative to the power box 20 is avoided, it is ensured that the amount of deformation generated by the first deformation section 432 is within a structurally reliable range, damage to the first deformation section 432 is avoided, and the use reliability of the LED display screen is improved.

It is to be noted that the moving stroke of the sealing frame 41 relative to the power box 20 refers to the displacement of the sealing frame 41 compared to its initial state in which it is unstressed.

As shown in FIGS. 5 and 7, the limiting structure 50 includes a limiting cylinder 51 disposed on a bottom wall of the sealing frame 41 and surrounding the second wiring hole 411, the limiting cylinder 51 extends downwards into the first wiring hole 21, and the floating gap includes a lateral floating gap formed between the limiting cylinder 51 and a hole wall of the first wiring hole 21. When the sealing frame 41 moves relative to the power box 20 in the radial direction of the sealing frame 41, since the lateral floating gap is formed between the limiting cylinder 51 and the hole wall of the first wiring hole 21, by utilizing the limiting effect of the first wiring hole 21 on the limiting cylinder 51, the excessive moving stroke of the sealing frame 41 relative to the power box 20 is avoided, damage to the first deformation section 432 is avoided, and the use reliability of the LED display screen is improved. Moreover, at a certain size of the second wiring hole 411, the size of the limiting cylinder 51 can be reduced since the limiting cylinder 51 downwards extends into the first wiring hole 21.

As shown in FIG. 5, the inner side of the second elastic seal ring 43 is connected with the bottom wall of the sealing frame 41 and located on an inner side of the limiting cylinder 51, and the outer side of the second elastic seal ring 43 is connected with an inner surface of a top wall of the power box 20. With the adoption of the above structure, the lateral floating gap can be sealed by utilizing the second elastic seal ring 43, then the sealing effect of the sealing assembly 40 is guaranteed, the service life of the LED display screen is prolonged, and the use safety of the LED display screen is improved.

The outer diameter of the limiting cylinder 51 is smaller than the hole diameter of the first wiring hole 21, the limiting cylinder 51 movably penetrates in the first wiring hole 21, by utilizing the limiting effect of the first wiring hole 21 on the limiting cylinder 51, the excessive moving stroke of the sealing frame 41 relative to the power box 20 is avoided, damage to the first deformation section 432 is avoided, and the use reliability of the LED display screen is improved.

It is to be noted that the limiting cylinder 51 surrounds the second wiring hole 411 refers to that the limiting cylinder 51 surrounds outside the second wiring hole 411, and the limiting cylinder 51 is equally spaced from the second wiring hole 411.

As shown in FIGS. 5 and 7, the limiting structure 50 further includes an annular limiting plate 53 and an annular projection 54, the annular limiting plate 53 is disposed on a side wall of the sealing frame 41 and surrounds the second wiring hole 411, the limiting cylinder 51 extends upwards to a lower surface of the limiting plate 53, the annular projection 54 is disposed on an outer surface of the top wall of the power box 20 and surrounds the first wiring hole 21, and the floating gap further includes a longitudinal floating gap formed between the lower surface of the annular limiting plate 53 and an upper surface of the annular projection 54. When the sealing frame 41 moves close to the box body 10 relative to the power box 20, since the longitudinal floating gap is formed between the lower surface of the annular limiting plate 53 and the upper surface of the annular projection 54, when the lower surface of the annular limiting plate 53 abuts against the upper surface of the annular projection 54, by utilizing the limiting effect of the annular projection 54 on the annular limiting plate 53, the excessive moving stroke of the sealing frame 41 relative to the power box 20 is avoided, damage to the first deformation section 432 is avoided, and the use reliability of the LED display screen is improved.

It is to be noted that a floating gap of the sealing frame 41 is formed between the lower surface of the annular limiting plate 53 and the upper surface of the annular projection 54 refers to the gap between the lower surface of the annular limiting plate 53 and the upper surface of the annular projection 54, and the sealing frame 41 is capable of floating relative to the power box 20 in the gap when the first deformation section 432 deforms under force.

In the embodiment, the LED display screen includes a plurality of display modules 30 and a plurality of sealing assemblies 40, the plurality of display modules 30 being disposed in one-to-one correspondence with the plurality of sealing assemblies 40. Thus, for the LED display screen, a sealing waterproofing effect can be achieved on the display modules 30 corresponding to the sealing assemblies 40 through the plurality of sealing assemblies.

It is to be noted that, the first elastic seal ring 42 is disposed on the sealing frame 41 and abuts against the display module 30 includes the following two embodiments.

(1) The first elastic seal ring 42 sleeves the side wall of the sealing frame 41, and abuts against the display module 30 in a direction vertical to the axis of the first elastic seal ring 42.

(2) In the axial direction of the first elastic seal ring 42, the first elastic seal ring 42 includes a first section and a second section which are connected, the first section of the first elastic seal ring 42 sleeves the side wall of the sealing frame 41, the second section of the first elastic seal ring 42 is disposed on the end wall, away from the power box 20, of the sealing frame 41, and in the axial direction of the first elastic seal ring 42, the second section of the first elastic seal ring 42 abuts against the display module 30.

The LED display screen provided by the embodiment has the following beneficial effects.

(1) When position offset occurs between the display module 30 and the power box 20, the sealing frame 41 is enabled to float relative to the power box 20 by utilizing elastic deformation of the second elastic seal ring 43, so that the position offset between the display module 30 and the power box 20 is eliminated, the position offset between the sealing frame 41 and the display module 30 is reduced, thereby ensuring an even distribution of the amount of compression deformation of the first elastic seal ring 42 around its circumference, promoting the use reliability of the sealing assembly 40, further, avoiding short circuit of the internal circuit caused by water entering into the power box 20, prolonging the service life of the LED display screen, and promoting the use safety of the LED display screen.

(2) When position offset occurs between the display module 30 and the power box 20, the first deformation section 432 is prone to deformation compared with the second deformation section 422, the amount of deformation generated the first deformation section 432 is greater than the amount of deformation generated by the second deformation section 422, so that the first deformation section 432 is capable of absorbing most of the position offset between the display module 30 and power box 20, then position offset between the sealing frame 41 and the display module 30 is further reduced, and the sealing waterproofing effect of second deformation section 422 on the display module 30 is guaranteed.

(3) The limiting structure 50 limits the moving stroke of the sealing frame 41 when floating relative to the power box 20, so that excessive moving stroke of the sealing frame 41 when floating relative to the power box 20 is avoided, it is ensured that the amount of deformation generated by the first deformed section 432 is within a structurally reliable range, damage to the first deformed section 432 is avoided, and the use reliability of the LED display screen is improved.

The above is only preferred embodiments of the disclosure and is not intended to limit the disclosure. Those skilled in the art may make various modifications and variations. Any modifications, equivalent replacements, improvements and the like made within the spirit and principle of the disclosure shall fall within the scope of protection of the disclosure.

What is claimed is:

1. A Light Emitting Diode display screen, comprising a box body, a power box, a display module and a sealing assembly, wherein the power box and the display module are both disposed on the box body, the power box is provided with a first wiring hole, an electric device in the power box is electrically connected with the display module through a connecting wire penetrating through the first wiring hole, and the sealing assembly comprises:
    a sealing frame, which is disposed at the first wiring hole and provided with a second wiring hole for avoiding the connecting wire, and a floating gap is formed between the sealing frame and the power box;
    a first elastic seal ring, which is disposed on the sealing frame and surrounds the second wiring hole, and the display module is connected with the sealing frame and is in butt fit with the first elastic seal ring so as to seal a joint of the display module and the sealing frame;
    a second elastic seal ring, an outer side of the second elastic seal ring is connected with the power box, an inner side of the second elastic seal ring is connected with the sealing frame and surrounds the second wiring hole, so as to seal the floating gap, and the sealing frame is supported by the second elastic seal ring so that the sealing frame is disposed in a floating mode relative to the power box.

2. The LED display screen according to claim 1, wherein the second elastic seal ring comprises a first connecting section, a first deformation section and a second connecting section which are sequentially connected from outside to inside, the first connecting section, the first deformation section and the second connecting section are all annular, the first connecting section is connected with the power box, the second connecting section is connected with the sealing frame and located on an outer side of the second wiring hole, and at least part of a longitudinal section of the first deformation section is of an arc-shaped structure.

3. The LED display screen according to claim 2, wherein a whole of the longitudinal section of the first deformation section is arc-shaped, and a middle part of the first deformation section protrudes towards a direction away from the sealing frame.

4. The LED display screen according to claim 2, wherein the sealing assembly further comprises:
    a first annular pressing plate, which is connected with the power box, and the first connecting section is clamped between the first annular pressing plate and the power box; and/or
    a second annular pressing plate, which is connected with the sealing frame, and the second connecting section is clamped between the second annular pressing plate and the sealing frame.

5. The LED display screen according to claim 2, wherein the sealing frame comprises a base and a first connecting cylinder disposed on the base, the second wiring hole is formed by an inner space of the first connecting cylinder, the display module is provided with a second connecting cylinder, the first connecting cylinder is in plug-in connection with the second connecting cylinder, and the first elastic seal ring is clamped between the first connecting cylinder and the second connecting cylinder in a radial direction of the second wiring hole.

6. The LED display screen according to claim 5, wherein the first elastic seal ring comprises a third connecting section, a second deformation section and a fourth connecting section which are sequentially connected along an axial direction of the second wiring hole, the third connecting section, the second deformation section and the fourth connecting section are all annular, both the third connecting section and the fourth connecting section abut against a cylinder wall of the first connecting cylinder, the second deformation section protrudes out of the third connecting section and the fourth connecting section in the radial direction of the second wiring hole, the second deformation section abuts against a cylinder wall of the second connecting cylinder, and at least part of a longitudinal section of the second deformation section is wave-shaped.

7. The LED display screen according to claim 1, wherein a limiting structure is disposed between the sealing frame and the power box to limit a moving stroke of the sealing frame when floating relative to the power box.

8. The LED display screen according to claim 7, wherein the limiting structure comprises a limiting cylinder disposed on a bottom wall of the sealing frame and surrounding the second wiring hole, the limiting cylinder extends downwards into the first wiring hole, and the floating gap comprises a lateral floating gap formed between the limiting cylinder and a hole wall of the first wiring hole.

9. The LED display screen according to claim 8, wherein the inner side of the second elastic seal ring is connected with the bottom wall of the sealing frame and located on an inner side of the limiting cylinder, and the outer side of the second elastic seal ring is connected with an inner surface of a top wall of the power box.

10. The LED display screen according to claim 8, wherein the limiting structure further comprises:
   an annular limiting plate, which is disposed on a side wall of the sealing frame and surrounds the second wiring hole;
   an annular projection, which is disposed on an outer surface of the top wall of the power box and surrounds the first wiring hole, and the floating gap further comprises a longitudinal floating gap formed between a lower surface of the annular limiting plate and an upper surface of the annular projection.

\* \* \* \* \*